United States Patent
Lin et al.

(10) Patent No.: US 7,916,064 B2
(45) Date of Patent: Mar. 29, 2011

(54) VOLTAGE-TO-TIME CONVERTER, AND VOLTAGE-TO-DIGITAL CONVERTING DEVICE HAVING THE SAME

(75) Inventors: Tsung-Hsien Lin, Taipei (TW); Chung-Hsing Yang, Taichung County (TW); Wei-Hao Chiu, Taipei (TW)

(73) Assignee: National Taiwan University, Taipei (TW)

( * ) Notice: Subject to any disclaimer, the term of this patent is extended or adjusted under 35 U.S.C. 154(b) by 23 days.

(21) Appl. No.: 12/469,749

(22) Filed: May 21, 2009

(65) Prior Publication Data

US 2010/0182186 A1 Jul. 22, 2010

(30) Foreign Application Priority Data

Jan. 22, 2009 (TW) ................................ 98102512 A (51) Int. Cl.
*H03M 1/50* (2006.01)
(52) U.S. Cl. ......................... 341/166; 341/155
(58) Field of Classification Search .................. 341/155, 341/161, 157; 327/100, 161, 158
See application file for complete search history.

(56) References Cited

U.S. PATENT DOCUMENTS 6,822,596 B2 * 11/2004 Theiler ........................ 341/155
7,446,693 B1 * 11/2008 Perraud ....................... 341/155

OTHER PUBLICATIONS

Begueret, J.B, et al. "Converters Dedicated to Long-Term Monitoring of Strain Gauge Transducers." IEEE JSSC, vol. 32, p. 349-356, Mar. 1997.
Bae, S.J. "A VCDL-based 60-760MHz Dual-Loop DLL With Infinited Phase-Shift Capability and Adaptive-Bandwidth Scheme." IEEE JSSC, vol. 40, pp. 1119-1129. May 2005.

* cited by examiner

*Primary Examiner* — Brian Young
(74) *Attorney, Agent, or Firm* — Dickstein Shapiro LLP (57) ABSTRACT

A voltage-to-digital converting device includes a first voltage-to-time converter outputting a first delay clock having a first time delay relative to a reference clock in response to an input voltage, and a second voltage-to-time converter outputting a second delay clock having a second time delay relative to the reference clock in response to a feedback voltage. The first and second time delays correspond respectively to the input and feedback voltages. A time-to-digital converting circuit receives the first and second delay clocks from the first and second voltage-to-time converters, compares phases of the first and second delay clocks, generates the feedback voltage based on result of phase comparison made thereby, and outputs a digital signal upon detecting that the phases of the first and second delay clocks are in-phase.

14 Claims, 7 Drawing Sheets

VOLTAGE-TO-TIME CONVERTER, AND VOLTAGE-TO-DIGITAL CONVERTING DEVICE HAVING THE SAME

CROSS-REFERENCE TO RELATED APPLICATION

This application claims priority of Taiwanese Application No. 098102512, filed on Jan. 22, 2009.

BACKGROUND OF THE INVENTION

1. Field of the Invention

The invention relates to a signal converting device, more particularly a voltage-to-digital converting device having a voltage-to-time converter.

2. Description of the Related Art

A conventional voltage-to-time converter proposed in an article by J.-B. Begueret, M. R. Benbrahim, Z. Li, F. Rodes and J.-P. Dom, entitled "Converters dedicated to long-term monitoring of strain gauge transducers", IEEE JSSC, vol. 32, pp. 349-356, March 1997, is capable of converting a voltage signal into a timing signal that is associated with resistance and capacitance of an RC-integrator. However, a drift of integrated circuit fabrication easily incurs an error in the capacitance of the RC-integrator. Furthermore, increased operating temperature may cause the resistance of the RC-integrator to vary. Therefore, due to non-ideal variance of the resistance, resolution of the timing signal generated by the conventional voltage-to-time converter is reduced.

Another conventional voltage-to-time converter proposed in an article by S.-J. Bae, H.-J. Chi, Y.-S. Sohn and H.-J. Park, entitled "A VCDL-based 60-760 MHz dual-loop DLL with infinite phase-shift capability and adaptive-bandwidth scheme", IEEE JSSC, vol. 40, pp. 1119-1129, May 2005, is capable of outputting a timing signal in response to an input voltage, where the timing signal has a time delay corresponding to the input voltage. However, the conventional voltage-to-time converter is based upon non-linear operation, i.e., the time delay is not proportional to the input voltage.

SUMMARY OF THE INVENTION

Therefore, an object of the present invention is to provide a voltage-to-digital converting device having a voltage-to-time converter that can overcome the aforesaid drawbacks of the prior art.

According to one aspect of the present invention, there is provided a voltage-to-digital converting device adapted for converting an input voltage into a digital signal. The voltage-to-digital converting device comprises:

a first voltage-to-time converter adapted for receiving a reference clock and the input voltage, and outputting a first delay clock in response to the input voltage, the first delay clock having a first time delay relative to the reference clock, the first time delay corresponding to the input voltage;

a second voltage-to-time converter adapted for receiving the reference clock and a feedback voltage, and outputting a second delay clock in response to the feedback voltage, the second delay clock having a second time delay relative to the reference clock, the second time delay corresponding to the feedback voltage; and a time-to-digital converting circuit coupled to the first and second voltage-to-time converters for receiving the first and second delay clocks therefrom, comparing phases of the first and second delay clocks, generating the feedback voltage based on result of phase comparison made thereby, and outputting the digital signal upon detecting that the phases of the first and second delay clocks are in-phase.

According to another aspect of the present invention, there is provided a voltage-to-digital converting device adapted for converting a difference between first and second voltages into a digital signal. The voltage-to-digital converting device comprises:

a first voltage-to-time converter adapted for receiving a reference clock and the first voltage, and outputting a first delay clock in response to the first voltage, the first delay clock having a first time delay relative to the reference clock, the first time delay corresponding to the first voltage;

a second voltage-to-time converter adapted for receiving the reference clock and the second voltage, and outputting a second delay clock in response to the second voltage, the second delay clock having a second time delay relative to the reference clock, the second time delay corresponding to the second voltage; and a time-to-digital converting circuit coupled to the first and second voltage-to-time converters for receiving the first and second delay clocks therefrom, and outputting the digital signal in accordance with a difference between phases of the first and second delay clocks.

According to a further aspect of the present invention, a voltage-to-time converter comprises:

a series connection of a current source, a first switch and a capacitor, the first switch having a control end for receiving a first control signal such that the first switch is operable between an ON-state and an OFF-state in response to the first control signal;

a comparator having a first input end coupled to a common node of the first switch and the capacitor, a second input end adapted for receiving an input voltage, and an output end;

a second switch adapted to be coupled between the first input end of the comparator and a reference voltage source, and having a control end for receiving a second control signal such that the second switch is operable between an ON-state and an OFF-state in response to the second control signal;

a first flip-flop having a high-level data input, a clock input adapted for receiving a reference clock, a clear input coupled to the output end of the comparator, a data output coupled to the control end of the first switch and outputting the first control signal to the control end of the first switch, and an inverted data output coupled to the control end of the second switch and outputting the second control signal to the control end of the second switch; and a second flip-flop having a low-level data input, a clock input adapted for receiving the reference clock, a set input coupled to the output end of the comparator, and a data output for outputting an output clock.

The output clock outputted by the second flip-flop has a time delay relative to the reference clock. The time delay corresponds to the input voltage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 1:
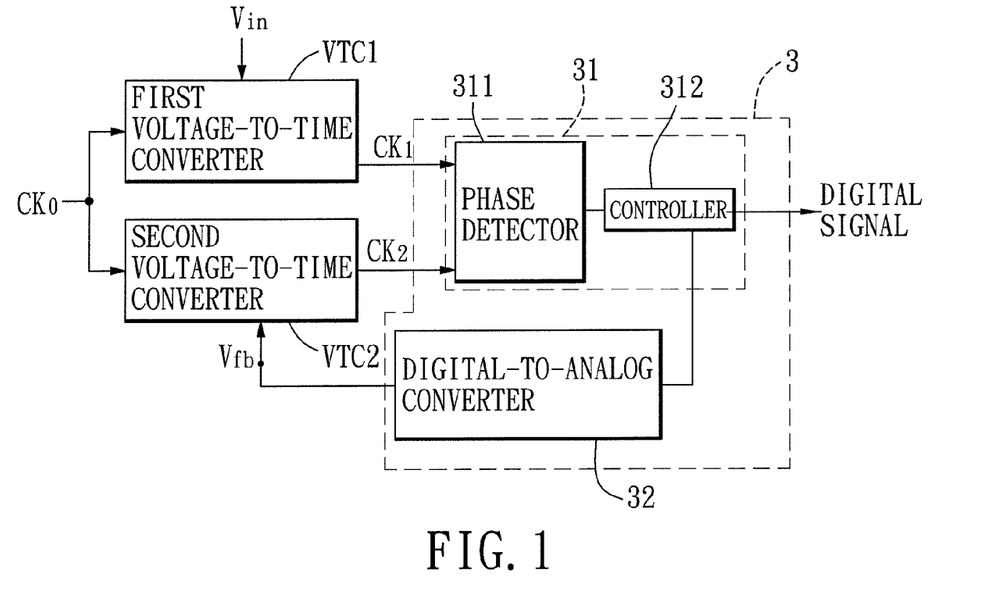
FIG. 1 is a schematic circuit block diagram illustrating the first preferred embodiment of a voltage-to-digital converting device according to the present invention.

Referring to FIG. 1, the first preferred embodiment of a voltage-to-digital converting device according to the present invention is shown to be adapted for converting an input voltage ($V_{in}$) into a digital signal. The voltage-to-digital converting device includes a first voltage-to-time converter (VTC1), a second voltage-to-time converter (VTC2), and a time-to-digital converting circuit 3.

The first voltage-to-time converter (VTC1) is adapted for receiving a reference clock ($CK_0$) and the input voltage ($V_{in}$), and outputs a first delay clock ($CK_1$) in response to the input voltage ($V_{in}$). The first delay clock ($CK_1$) has a first time delay ($T_{delay}$) relative to the reference clock ($V_{in}$) (see FIG. 3f). The first time delay ($T_{delay}$) corresponds to the input voltage ($V_{in}$). Preferably, the first time delay ($T_{delay}$) of the first delay clock ($CK_1$) outputted by the first voltage-to-time converter (VTC1) is proportional to the input voltage ($V_{in}$).

Figure 2:
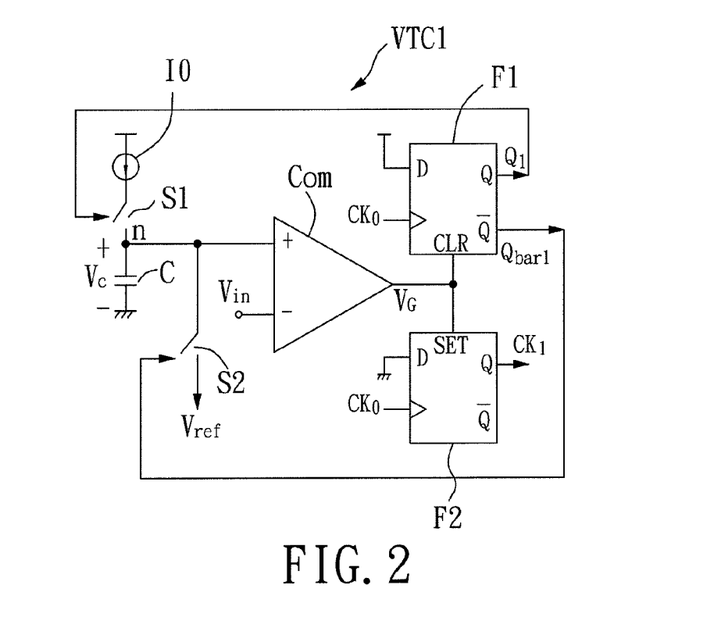
FIG. 2 is a schematic electrical circuit diagram illustrating a first voltage-to-time converter of the first preferred embodiment.

In this embodiment, referring further to FIG. 2, the first voltage-to-time converter (VCT1) includes a series connection of a current source (I0), a first switch (S1) and a capacitor (C), a comparator (Com), a second switch (S2), a first flip-flop (F1), and a second flip-flop (F2). The first switch (S1) has a control end for receiving a first control signal ($Q_1$) such that the first switch (S1) is operable between an ON-state and an OFF-state in response to the first control signal ($Q_1$). The comparator (Com) has a non-inverting input end serving as a first input end and coupled to a common node (n) of the first switch (S1) and the capacitor (C), an inverting input end serving as a second input end and adapted for receiving the input voltage ($V_{in}$), and an output end for outputting an output signal ($V_G$). The second switch (S2) is adapted to be coupled between the non-inverting input end of the comparator (Com) and a reference voltage source (not shown) supplying a reference voltage ($V_{ref}$) that is less than the input voltage ($V_{in}$), and has a control end for receiving a second control signal ($Q_{bar1}$) such that the second switch (S2) is operable between an ON-state and an OFF-state in response to the second control signal ($Q_{bar1}$). The first flip-flop (F1) has a high-level data input (D), a clock input adapted for receiving the reference clock ($CK_0$), a clear input (CLR) coupled to the output end of the comparator (Com), a data output (Q) coupled to the control end of the first switch (S1) and outputting the first control signal ($Q_1$) to the control end of the first switch (S1), and an inverted data output ($\overline{Q}$) coupled to the control end of the second switch (S2) and outputting the second control signal ($Q_{bar1}$) to the control end of the second switch (S2). The second flip-flop (F2) has a low-level data input (D), a clock input adapted for receiving the reference clock ($CK_0$), a set input (SET) coupled to the output end of the comparator (Com), and a data output (Q) for outputting the first delay clock ($CK_1$).

Figure 3A:
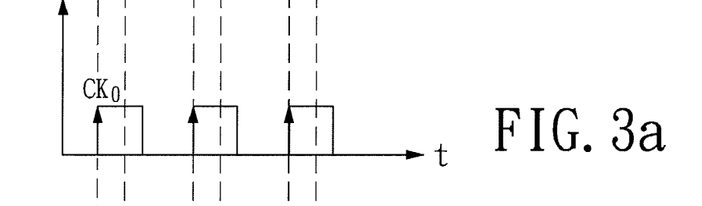
FIGS. 3a to 3f are timing diagrams illustrating a reference clock ($CK_0$), a first control signal ($Q_1$), a second control signal ($Q_{bar1}$), a voltage ($V_C$) across a capacitor of the first voltage-to-time converter, an output signal ($V_G$) outputted by a comparator of the first voltage-to-time converter, and a first delay clock ($CK_1$) respectively.
Figure 3B:
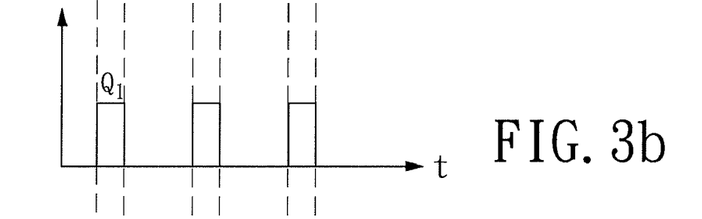
Figure 3C:
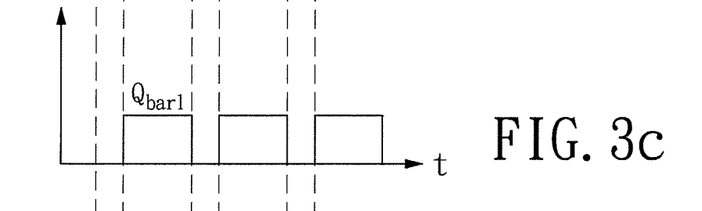
Figure 3D:
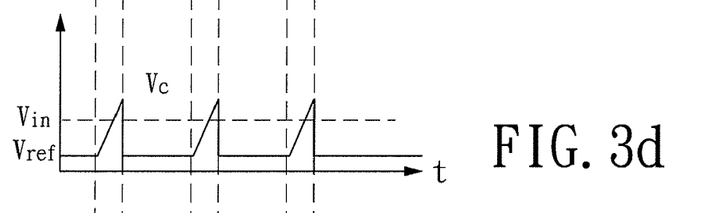
Figure 3E:
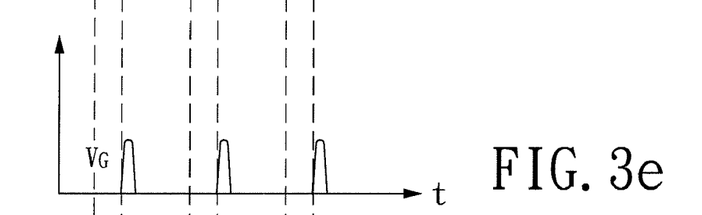
Figure 3F:
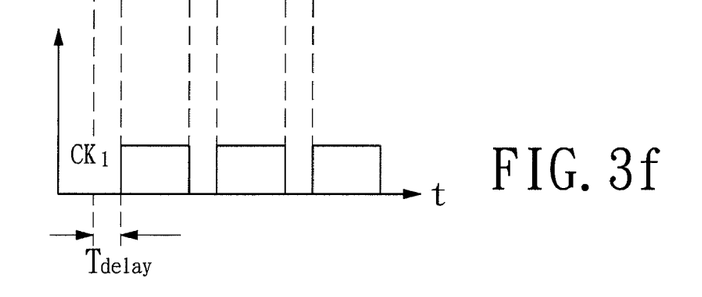

Referring further to FIGS. 3a to 3f, operation of the first voltage-to-time converter (VCT1) is described hereinbelow. FIG. 3a illustrates the reference clock ($CK_0$). FIG. 3b illustrates the first control signal ($Q_1$) outputted at the data output (Q) of the first flip-flop (F1). FIG. 3c illustrates the second control signal ($Q_{bar1}$) outputted at the inverted data output ($\overline{Q}$) of the first flip-flop (F1). FIG. 3d illustrates a voltage ($V_C$) across the capacitor (C). FIG. 3e illustrates the output signal ($V_G$) outputted at the output end of the comparator (Com). FIG. 3f illustrates the first delay clock ($CK_1$) outputted at the data output (Q) of the second flip-flop (F2).

When the reference clock ($CK_0$) is switched from a low level to a high level, the first control signal ($Q_1$) outputted at the data output (Q) of the first flip-flop (F1) has a high level such that the first switch (S1) is in the ON-state, and the second control signal ($Q_{bar1}$) outputted at the inverted data output ($\overline{Q}$) of the first flip-flop (F1) has a low level such that the second switch (S2) is in the OFF-state. In this case, the capacitor (C) is charged through the first switch (S1) with a current supplied by the current source (I0), as shown in FIG. 3d. Thereafter, when the voltage ($V_C$) across the capacitor (C) is greater than the input voltage ($V_{in}$), the output signal ($V_G$) outputted at the output end of the comparator (Com) is switched to a high level, as shown in FIG. 3e. In this case, the first control signal ($Q_1$) is switched from the high level to a low level such that the first switch (S1) is in the OFF-state, and the second control signal ($Q_{bar1}$) outputted at the inverted data output ($\overline{Q}$) of the first flip-flop (F1) is switched from the low level to the high level such that the second switch (S2) is in the ON-state. On the other hand, the first delay clock ($CK_1$) is switched from a low level to a high level. Due to conduction of the second switch (S2), the voltage ($V_C$) across the capacitor (C) is pulled down to the reference voltage ($V_{ref}$) such that the output signal ($V_G$) outputted at the output end of the comparator (Com) is pulled down to a low level. The first delay clock ($CK_1$) remains at the high level prior to a next rising edge of the reference clock ($CK_0$). Therefore, as shown in FIG. 3f, the first delay clock ($CK_1$) has the first time delay ($T_{delay}$) relative to the reference clock ($CK_0$).

In this embodiment, the current supplied by the current source (I0) is a constant current ($I_{const}$), and the capacitor (C) has a constant capacitance ($C_{const}$). Thus, a quantity ($Q_C$) of electric charges accumulated in the capacitor (C) is represented as follows:

$$Q_C = I_{const} \cdot T_{delay} = C_{const} \cdot V_{in}$$

$$V_{in} = (I_{const}/C_{const}) \cdot T_{delay} \Rightarrow V_{in} \propto T_{delay}$$

Therefore, the first voltage-to-time converter (VCT1) has linear conversion characteristics.

Figure 4:
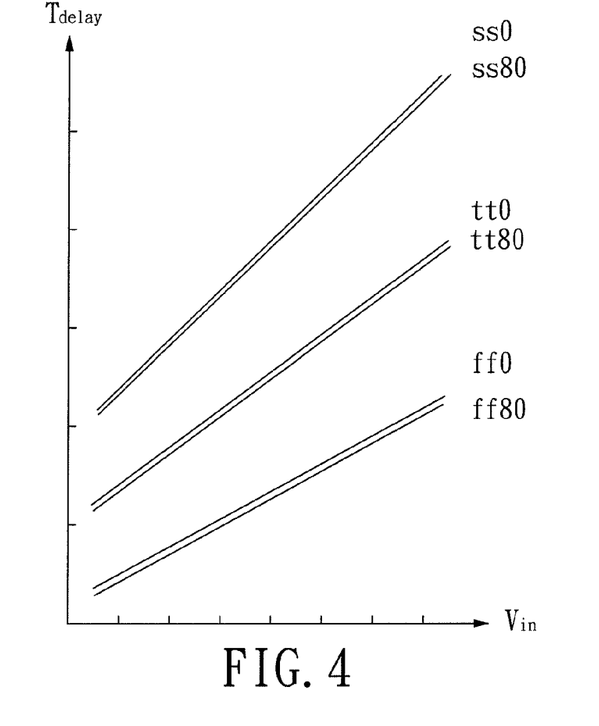
FIG. 4 is a plot of experimental measurement results for illustrating relationships between an input voltage and a first time delay of the first delay clock at different operating temperatures under various fabrication conditions.

FIG. 4 illustrates relationships between the input voltage ($V_{in}$) and the first time delay ($T_{delay}$) of the first delay clock ($CK_1$) at different operating temperatures under various fabrication conditions, wherein "ss0" indicates a linear relationship at an operating temperature of 0° C. under a worst fabrication condition, "ss80" indicates a linear relationship at an operating temperature of 80° C. under the worst fabrication condition, "tt0" indicates a linear relationship at the operating temperature of 0° C. under a normal fabrication condition, "tt80" indicates a linear relationship at the operating temperature of 80° C. under the normal fabrication condition, "ff0" indicates a linear relationship at the operating temperature of 0° C. under a best fabrication condition, and "ff80" indicates a linear relationship at the operating temperature of 80° C. under the best fabrication condition.

The second voltage-to-time converter (VTC2) is adapted for receiving the reference clock ($CK_0$) and a feedback voltage ($V_{fb}$), and outputs a second delay clock ($CK_2$) in response to the feedback voltage ($V_{fb}$). The second delay clock ($CK_2$) has a second time delay relative to the reference clock ($CK_0$). The second time delay corresponds to the feedback voltage ($V_{fb}$). Preferably, the second time delay of the second delay clock ($CK_2$) outputted by the second voltage-to-time converter (VTC2) is proportional to the feedback voltage ($V_{fb}$).

Figure 5:
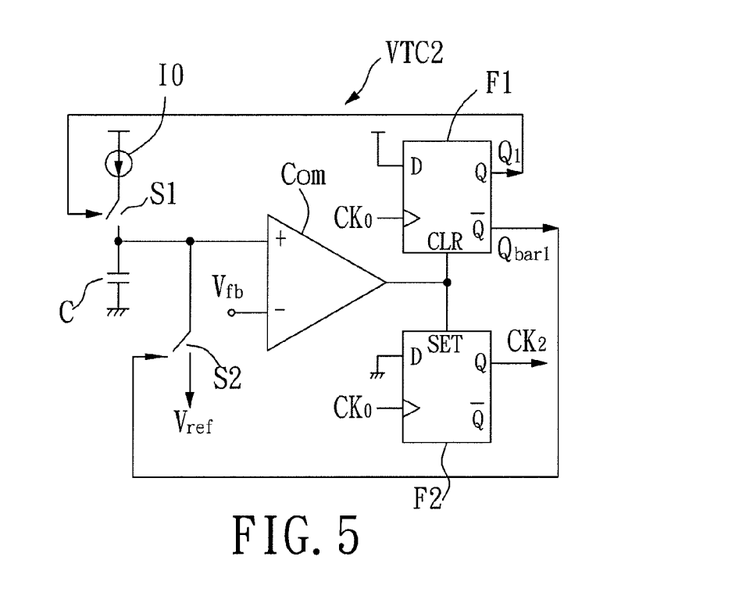
FIG. 5 is a schematic electrical circuit diagram illustrating a second voltage-to-time converter of the first preferred embodiment.

In this embodiment, referring further to FIG. 5, the second voltage-to-time converter (VTC2) has the same configuration as that of the first voltage-to-time converter (VCT1). The second voltage-to-time converter (VTC2) differs from the first voltage-to-time converter (VCT1) in that the inverting input end of the comparator (Com) receives the feedback voltage ($V_{fb}$). Since the first and second voltage-to-time converters (VCT1, VTC2) have the same configuration, an error of device parameters for each of the first and second voltage-to-time converters (VCT1, VTC2) caused by fluctuation of an external voltage source or temperature variation can be canceled or compensated.

It is noted that, in other embodiments, the input voltage ($V_{in}$) is not required to be constant, and can be a biomedical signal that has slow and small fluctuations.

The time-to-digital converting circuit 3 is coupled to the first and second voltage-to-time converters (VTC1, VTC2) for receiving the first and second delay clocks ($CK_1$, $CK_2$) therefrom, compares phases of the first and second delay clocks ($CK_1$, $CK_2$), generates the feedback voltage ($V_{fb}$) based on result of phase comparison made thereby, and outputs the digital signal upon detecting that the phases of the first and second delay clocks ($CK_1$, $CK_2$) are in-phase.

In this embodiment, as shown in FIG. 1, the time-to-digital converting circuit 3 includes a time-to-digital converter 31 and a digital-to-analog converter 32.

The time-to-digital converter 31 includes a phase detector 311 and a controller 312. The phase detector 311 is coupled to the first and second voltage-to-time converters (VTC1, VTC2) for receiving the first and second delay clocks ($CK_1$, $CK_2$) therefrom, detects and compares the phases of the first and second delay clocks ($CK_1$, $CK_2$), and outputs a comparison result. The controller 312 is coupled to the phase detector 311, and outputs a digital output based on the comparison result from the phase detector 311.

The digital-to-analog converter 32 is coupled to the controller 312 of the time-to-digital converter 31 for receiving the digital output therefrom, converts the digital output from the controller 312 into the feedback voltage ($V_{fb}$), and outputs the feedback voltage ($V_{fb}$) to the second voltage-to-time converter (VTC2).

The controller 312 of the time-to-digital converter 31 outputs the digital output that serves as the digital signal when the phase detector 311 detects that the phases of the first and second delay clocks ($CK_1$, $CK_2$) are in-phase. It is noted that, in this embodiment, the controller 312 is configured to increase a value of the digital output when the phase detector 311 detects that the phase of the second delay clock ($CK_2$) leads that of the first delay clock ($CK_1$), and to decrease the value of the digital output when the phase detector 311 detects that the phase of the second delay clock ($CK_2$) lags that of the first delay clock ($CK_1$).

Figure 6:
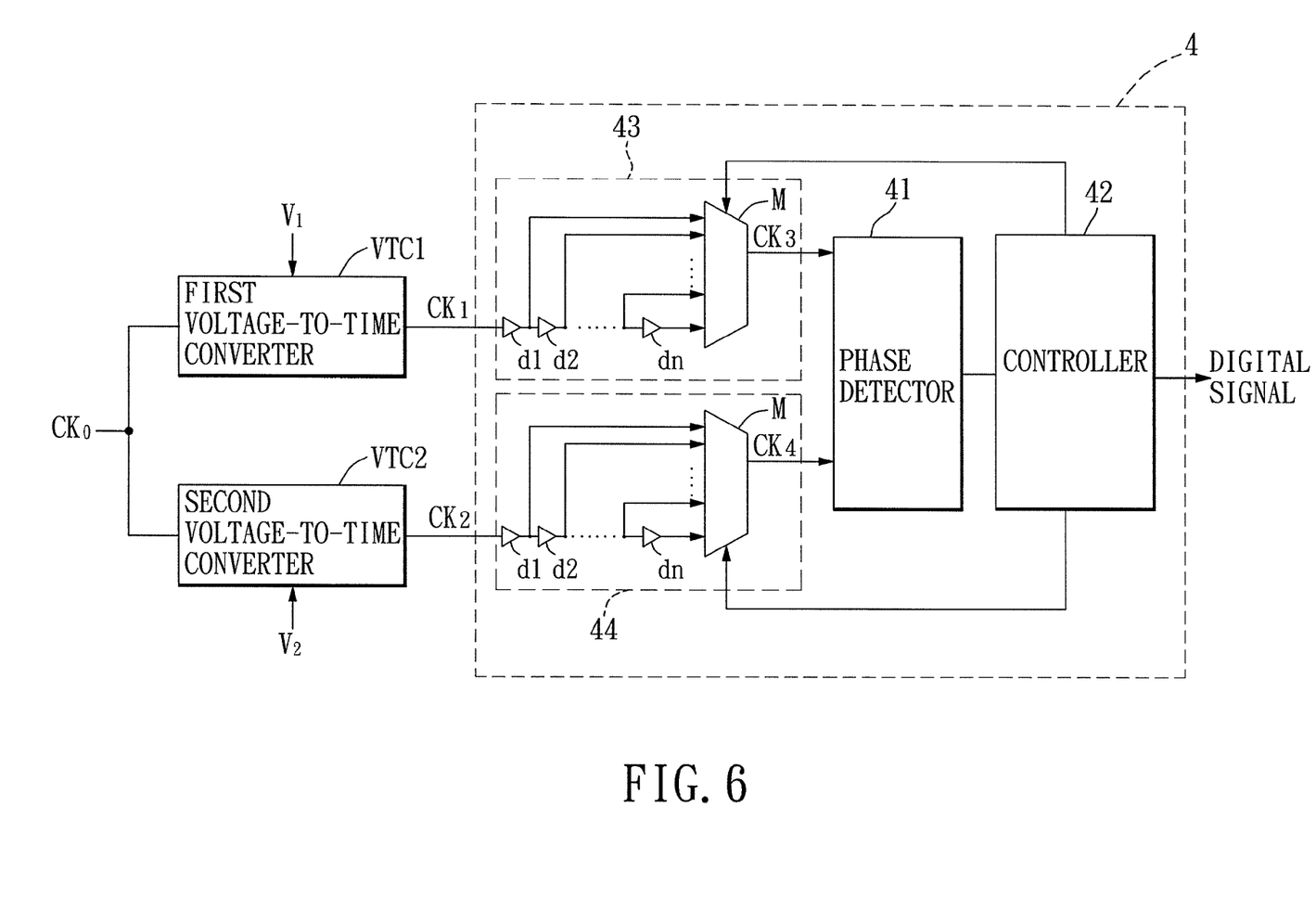
FIG. 6 is a schematic electrical circuit block diagram illustrating the second preferred embodiment of a voltage-to-digital converting device according to the present invention.
Figure 7A:
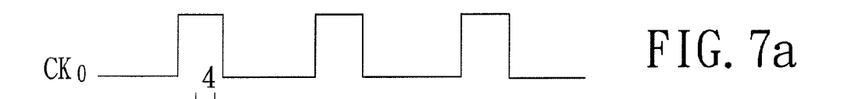
FIGS. 7a to 7e are timing diagrams illustrating the reference clock ($CK_0$), the first delay clock ($CK_1$), a second delay clock ($CK_2$), a third delay clock ($CK_3$), and a fourth delay clock ($CK_4$), respectively, in an example performed by the second preferred embodiment.
Figure 7B:
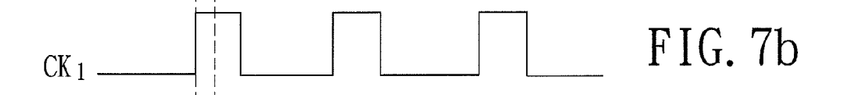
Figure 7C:
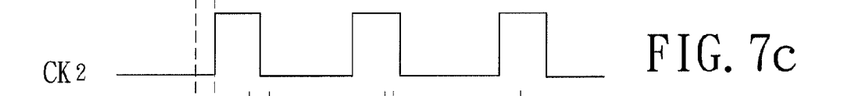
Figure 7D:
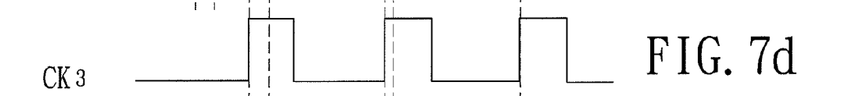
Figure 7E:
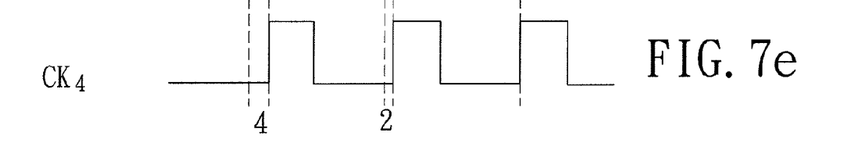

FIG. 6 illustrates the second preferred embodiment of a voltage-to-digital converting device according to this invention, which is a modification of the first preferred embodiment. In this embodiment, the voltage-to-digital converting device is adapted for converting a difference between first and second voltages ($V_1$, $V_2$) into a digital signal.

Unlike the first preferred embodiment, the first voltage-to-time converter (VCT1) outputs the first delay clock ($CK_1$) in response to the first voltage ($V_1$), and the second voltage-to-time converter (VTC2) outputs the second delay clock ($CK_2$) in response to the second voltage ($V_2$). The first time delay of the first delay clock ($CK_1$) outputted by the first voltage-to-time converter (VCT1) is proportional to the first voltage ($V_1$). The second time delay of the second delay clock ($CK_2$) outputted by the second voltage-to-time converter (VTC2) is proportional to the second voltage ($V_2$).

Furthermore, the time-to-digital converting circuit 4 outputs the digital signal in accordance with a difference between the phases of the first and second delay clocks ($CK_1$, $CK_2$). The time-to-digital converting circuit 4 is configured to adjust continuously the phase of at least one of the first and second delay clocks ($CK_1$, $CK_2$) until the phases of the first and second delay clocks ($CK_1$, $CK_2$) are in-phase. The digital signal has a value associated with the number of times the phase of said at least one of the first and second delay clocks ($CK_1$, $CK_2$) was adjusted.

In this embodiment, the time-to-digital converting circuit 4 includes a first delayer 43, a second delayer 44, a phase detector 41, and a controller 42.

The first delayer 43 is coupled to the first voltage-to-time converter (VCT1) for receiving the first delay clock ($CK_1$) therefrom, is operable so as to delay the phase of the first delay clock ($CK_1$) in response to a first control signal, and outputs a third delay clock ($CK_3$) having a time delay relative to the first delay clock ($CK_1$).

The second delayer 44 is coupled to the second voltage-to-time converter (VTC2) for receiving the second delay clock ($CK_2$) therefrom, is operable so as to delay the phase of the second delay clock ($CK_2$) in response to a second control signal, and outputs a fourth delay clock ($CK_4$) having a time delay relative to the second delay clock ($CK_2$).

Each of the first and second delayers 43, 44 includes a series connection of delay components (d1-dn), and a multiplexer (M). For each of the first and second delayers 43, 44, the series connection of the delay components (d1-dn) is coupled to a corresponding one of the first and second voltage-to-time converters (VTC1, VTC2) for receiving a corresponding one of the first and second delay clocks ($CK_1$, $CK_2$) therefrom. Each of the delay components (d1-dn) has an output. The multiplexer (M) of each of the first and second delayers 43, 44 has a plurality of input ends coupled respectively to the outputs of the delay components (d1-dn) of the corresponding one of the first and second delayers 43, 44, a control end for receiving a corresponding one of the first and second control signals, and an output end for outputting a corresponding one of the third and fourth delay clocks ($CK_3$, $CK_4$), and is operable to establish electrical connection between the output of one of the delay components (d1-dn) of the corresponding one of the first and delayers 43, 44 and the output end in response to the corresponding one of the first and second control signals.

The phase detector 41 is coupled to the output ends of the multiplexers (M) of the first and second delayers 43, 44 for receiving the third and fourth delay clocks ($Ck_3$, $CK_4$) therefrom, detects and compares phases of the third and fourth delay clocks ($Ck_3$, $CK_4$), and outputs a comparison result.

The controller 42 is coupled to the phase detector 41 and to the control ends of the multiplexers (M) of the first and second delayers 43, 44, receives the comparison result from the phase detector 41, outputs respectively the first and second control signal to the control ends of the multiplexers (M) of the first and second delayers 43, 44 in response to the comparison result so as to bring the phases of the third and fourth delay clocks ($Ck_3$, $CK_4$) closer to each other, and outputs the digital signal when the comparison result indicates that the phases of the third and fourth delay clocks ($Ck_3$, $CK_4$) are in-phase.

Referring further to FIGS. 7*a* to 7*e*, and 8 to 10, an example performed by the voltage-to-digital converting device of the second preferred embodiment is described hereinbelow, wherein a difference between the phases of the first and second delay clocks ($CK_1$, $CK_2$) outputted by the first and second voltage-to-time converters (VTC1, VTC2) is four time delay units (see FIGS. 7*b* and 7*c*), and each of the delay components (d1-dn) delays a signal inputted thereto by one time delay unit.

Figure 8:
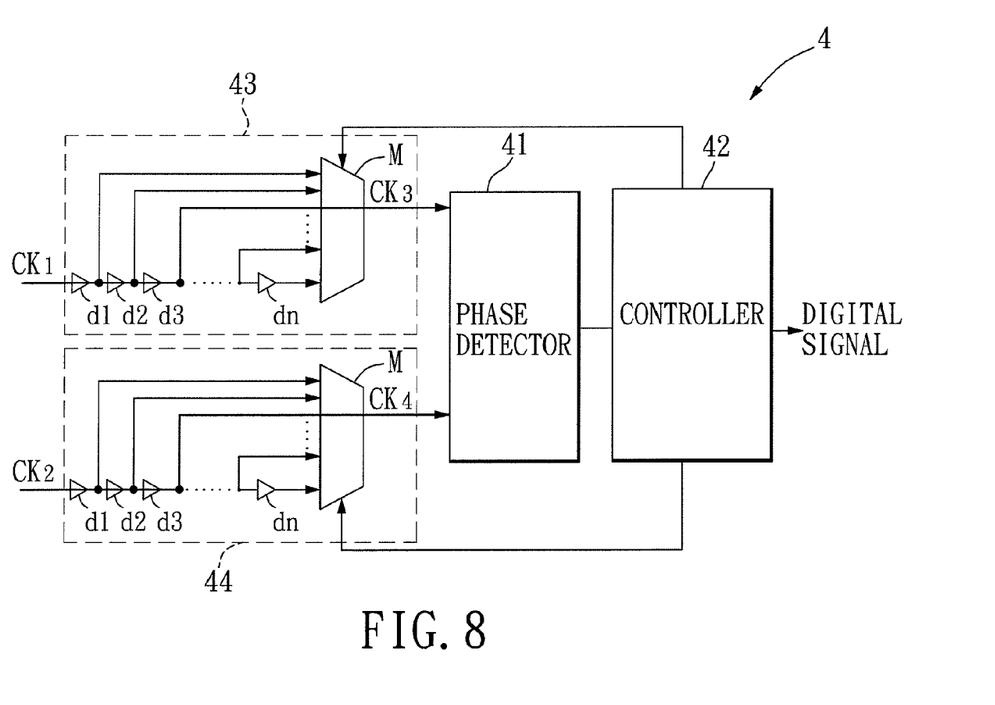
FIGS. 8 to 10 are schematic electrical circuit block diagrams illustrating operation of a time-to-digital converting circuit of the second preferred embodiment in the example.

Initially, during a first clock of the reference clock ($CK_0$), the controller 42 outputs respectively predetermined first and second control signals to the multiplexers (M) of the first and second delayers 43, 44 such that each of the multiplexers (M) of the first and second delayers 43, 44 is operable to establish electrical connection between the delay component (d3) and the phase detector 41 in response to a corresponding one of the predetermined first and second control signals, as shown in FIG. 8. Thus, the phase detector 41 detects that a difference between phases of the third and fourth delay clocks ($CK_3$, $CK_4$) outputted by the first and second delayers 43, 44 is still four time delay units (see FIGS. 7*d* and 7*e*).

Figure 9:
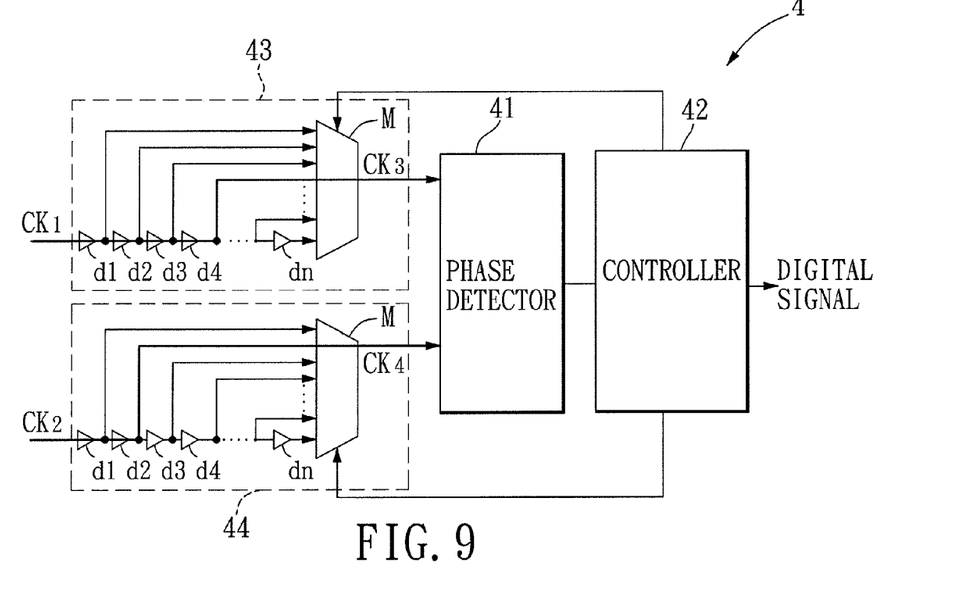

Then, during a second clock of the reference clock ($CK_0$), the controller 42 updates the first and second control signals in response to the comparison result from the phase detector 41, and outputs the first and second control signals updated thereby to the multiplexers (M) of the first and second delayers 43, 44 such that the multiplexer (M) of the first delayer 43 is operable to establish electrical connection between the delay component (d4) and the phase detector 41 in response to the updated first control signal and that the multiplexer (M) of the second delayer 44 is operable to establish electrical connection between the delay component (d2) and the phase detector 41 in response to the updated second control signal, as shown in FIG. 9. In this case, the phase detector 41 detects that the difference between the phases of the third and fourth delay clocks ($CK_3$, $CK_4$) outputted by the first and second delayers 43, 44 becomes two time delay units (see FIGS. 7*d* and 7*e*). At the same time, the value of the digital signal is added by 2.

Figure 10:
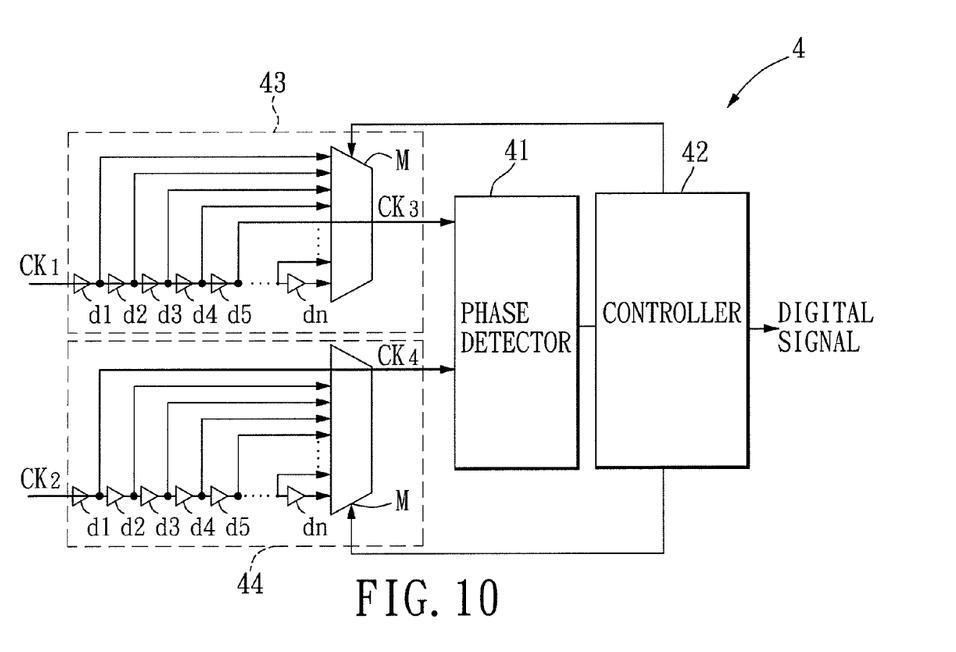

Thereafter, during a third clock of the reference clock ($CK_0$), the controller 42 updates the first and second control signals once again in response to the comparison result from the phase detector 41, and outputs the first and second control signals updated thereby to the multiplexers (M) of the first and second delayers 43, 44 such that the multiplexer (M) of the first delayer 43 is operable to establish electrical connection between the delay component (d5) and the phase detector 41 in response to the updated first control signal and that the multiplexer (M) of the second delayer 44 is operable to establish electrical connection between the delay component (d1) and the phase detector 41 in response to the updated second control signal, as shown in FIG. 10. In this case, the phase detector 41 detects that the phases of the third and fourth delay clocks ($CK_3$, $CK_4$) outputted by the first and second delayers 43, 44 are in-phase (see FIGS. 7*d* and 7*e*). At the same time, the value of the digital signal is added by 2. Finally, the controller 42 outputs the digital signal.

Figure 11:
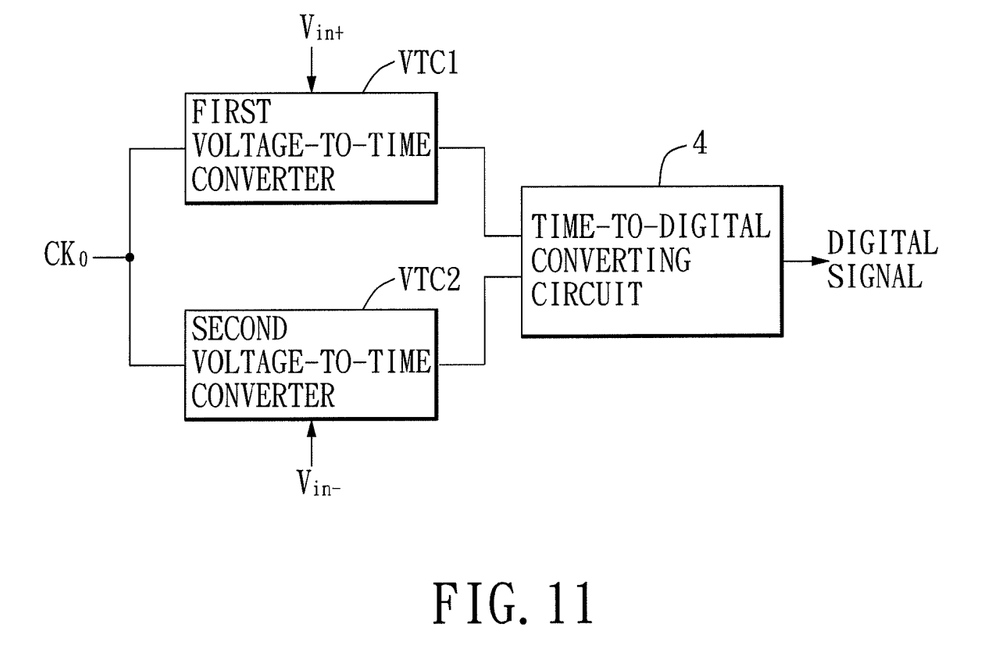
FIG. 11 is a schematic circuit block diagram illustrating another application of the second preferred embodiment.

FIG. 11 illustrates another application of the second preferred embodiment, wherein a differential voltage pair ($V_{in+}$, $V_{in-}$) serves as the first and second voltages.

In sum, due to the inclusion of the first and second voltage-to-time converters (VCT1, VTC2) having the same configuration and linear operation characteristics, an adverse effect caused by a drift of fabrication process, voltage variation or temperature variation can be compensated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A voltage-to-digital converting device adapted for converting an input voltage into a digital signal, said voltage-to-digital converting device comprising:
   a first voltage-to-time converter adapted for receiving a reference clock and the input voltage, and outputting a first delay clock in response to the input voltage, the first delay clock having a first time delay relative to the reference clock, the first time delay corresponding to the input voltage;
   a second voltage-to-time converter adapted for receiving the reference clock and a feedback voltage, and outputting a second delay clock in response to the feedback voltage, the second delay clock having a second time delay relative to the reference clock, the second time delay corresponding to the feedback voltage; and
   a time-to-digital converting circuit coupled to said first and second voltage-to-time converters for receiving the first and second delay clocks therefrom, comparing phases of the first and second delay clocks, generating the feedback voltage based on result of phase comparison made thereby, and outputting the digital signal upon detecting that the phases of the first and second delay clocks are in-phase.

2. The voltage-to-digital converting device as claimed in claim 1, wherein:
   the first time delay of the first delay clock outputted by said first voltage-to-time converter is proportional to the input voltage; and
   the second time delay of the second delay clock outputted by said second voltage-to-time converter is proportional to the feedback voltage.

3. The voltage-to-digital converting device as claimed in claim 1, wherein said first voltage-to-time converter includes:
   a series connection of a current source, a first switch and a capacitor, said first switch having a control end for receiving a first control signal such that said first switch is operable between an ON-state and an OFF-state in response to the first control signal;
   a comparator having a first input end coupled to a common node of said first switch and said capacitor, a second input end adapted for receiving the input voltage, and an output end;

a second switch adapted to be coupled between said first input end of said comparator and a reference voltage source, and having a control end for receiving a second control signal such that said second switch is operable between an ON-state and an OFF-state in response to the second control signal;

a first flip-flop having a high-level data input, a clock input adapted for receiving the reference clock, a clear input coupled to said output end of said comparator, a data output coupled to said control end of said first switch and outputting the first control signal to said control end of said first switch, and an inverted data output coupled to said control end of said second switch and outputting the second control signal to said control end of said second switch; and a second flip-flop having a low-level data input, a clock input adapted for receiving the reference clock, a set input coupled to said output end of said comparator, and a data output for outputting the first delay clock.

4. The voltage-to-digital converting device as claimed in claim 1, wherein said second voltage-to-time converter includes:

a series connection of a current source, a first switch and a capacitor, said first switch having a control end for receiving a first control signal such that said first switch is operable between an ON-state and an OFF-state in response to the first control signal;

a comparator having a first input end coupled to a common node of said first switch and said capacitor, a second input end for receiving the feedback voltage from said time-to-digital converting circuit, and an output end;

a second switch adapted to be coupled between said first input end of said comparator and a reference voltage source, and having a control end for receiving a second control signal such that said second switch is operable between an ON-state and an OFF-state in response to the second control signal;

a first flip-flop having a high-level data input, a clock input adapted for receiving the reference clock, a clear input coupled to said output end of said comparator, a data output coupled to said control end of said first switch and outputting the first control signal to said control end of said first switch, and an inverted data output coupled to said control end of said second switch and outputting the second control signal to said control end of said second switch; and a second flip-flop having a low-level data input, a clock input adapted for receiving the reference clock, a set input coupled to said output end of said comparator, and a data output for outputting the second delay clock.

5. The voltage-to-digital converting device as claimed in claim 1, wherein said time-to-digital converting circuit includes:

a time-to-digital converter coupled to said first and second voltage-to-time converters for receiving the first and second delay clocks therefrom, comparing the phases of the first and second delay clocks, and outputting a digital output based on result of phase comparison made thereby; and a digital-to-analog converter coupled to said time-to-digital converter for receiving the digital output therefrom, converting the digital output from said time-to-digital converter into the feedback voltage, and outputting the feedback voltage to said second voltage-to-time converter;

said time-to-digital converter outputting the digital output that serves as the digital signal upon detecting that the phases of the first and second delay clocks are in-phase.

6. The voltage-to-digital converting device as claimed in claim 5, wherein said time-to-digital converter is configured to increase a value of the digital output upon detecting that the phase of the second delay clock leads that of the first delay clock, and to decrease the value of the digital output upon detecting that the phase of the second delay clock lags that of the first delay clock.

7. A voltage-to-digital converting device adapted for converting a difference between first and second voltages into a digital signal, said voltage-to-digital converting device comprising:

a first voltage-to-time converter adapted for receiving a reference clock and the first voltage, and outputting a first delay clock in response to the first voltage, the first delay clock having a first time delay relative to the reference clock, the first time delay corresponding to the first voltage;

a second voltage-to-time converter adapted for receiving the reference clock and the second voltage, and outputting a second delay clock in response to the second voltage, the second delay clock having a second time delay relative to the reference clock, the second time delay corresponding to the second voltage; and a time-to-digital converting circuit coupled to said first and second voltage-to-time converters for receiving the first and second delay clocks therefrom, and outputting the digital signal in accordance with a difference between phases of the first and second delay clocks, wherein the first time delay of the first delay clock outputted by said first voltage-to-time converter is proportional to the first voltage; and wherein the second time delay of the second delay clock outputted by said second voltage-to-time converter is proportional to the second voltage.

8. The voltage-to-digital converting device as claimed in claim 7, wherein said first voltage-to-time converter includes:

a series connection of a current source, a first switch and a capacitor, said first switch having a control end for receiving a first control signal such that said first switch is operable between an ON-state and an OFF-state in response to the first control signal;

a comparator having a first input end coupled to a common node of said first switch and said capacitor, a second input end adapted for receiving the first voltage, and an output end;

a second switch adapted to be coupled between said first end of said comparator and a reference voltage source, and having a control end for receiving a second control signal such that said second switch is operable between an ON-state and an OFF-state in response to the second control signal;

a first flip-flop having a high-level data input, a clock input adapted for receiving the reference clock, a clear input coupled to said output end of said comparator, a data output coupled to said control end of said first switch and outputting the first control signal to said control end of said first switch, and an inverted data output coupled to said control end of said second switch and outputting the second control signal to said control end of said second switch; and a second flip-flop having a low-level data input, a clock input adapted for receiving the reference clock, a set input coupled to said output end of said comparator, and a data output for outputting the first delay clock.

9. The voltage-to-digital converting device as claimed in claim 7, wherein said second voltage-to-time converter includes:
- a series connection of a current source, a first switch and a capacitor, said first switch having a control end for receiving a first control signal such that said first switch is operable between an ON-state and an OFF-state in response to the first control signal;
- a comparator having a first input end coupled to a common node of said first switch and said capacitor, a second input end adapted for receiving the second voltage, and an output end;
- a second switch adapted to be coupled between said first input end of said comparator and a reference voltage source, and having a control end for receiving a second control signal such that said second switch is operable between an ON-state and an OFF-state in response to the second control signal;
- a first flip-flop having a high-level data input, a clock input adapted for receiving the reference clock, a clear input coupled to said output end of said comparator, a data output coupled to said control end of said first switch and outputting the first control signal to said control end of said first switch, and an inverted data output coupled to said control end of said second switch and outputting the second control signal to said control end of said second switch; and
- a second flip-flop having a low-level data input, a clock input adapted for receiving the reference clock, a set input coupled to said output end of said comparator, and a data output for outputting the second delay clock.

10. The voltage-to-digital converting device as claimed in claim 7, wherein said time-to-digital converting circuit is configured to adjust continuously the phase of at least one of the first and second delay clocks until the phases of the first and second delay clocks after being adjusted for a number of times are in-phase, the digital signal having a value associated with the number of times the phase of said at least one of the first and second delay clocks was adjusted.

11. The voltage-to-digital converting device as claimed in claim 10, wherein said time-to-digital converting circuit includes:
- a first delayer coupled to said first voltage-to-time converter for receiving the first delay clock therefrom and operable so as to delay the phase of the first delay clock in response to a first control signal;
- a second delayer coupled to said second voltage-to-time converter for receiving the second delay clock therefrom and operable so as to delay the phase of the second delay clock in response to a second control signal;
- a phase detector coupled to said first and second delayers, detecting and comparing the phases of the first and second delay clocks delayed respectively by said first and second delayers, and outputting a comparison result; and
- a controller coupled to said phase detector, and said first and second delayers, receiving the comparison result from said phase detector, outputting respectively the first and second control signals to said first and second delayers in response to the comparison result so as to bring the phases of the first and second delay clocks delayed respectively by said first and second delayers closer to each other, and outputting the digital signal when the comparison result indicates that the phases of the first and second delay clocks delayed respectively by said first and second delayers are in-phase.

12. The voltage-to-digital converting device as claimed in claim 11, wherein each of said first and second delayers includes:
- a series connection of delay components coupled to a corresponding one of said first and second voltage-to-time converters for receiving a corresponding one of the first and second delay clocks therefrom, each of said delay components having an output; and
- a multiplexer coupled to said outputs of said delay components of a corresponding one of said first and second delayers, further coupled to said phase detector and said controller, and operable to establish electrical connection between said output of one of said delay components of the corresponding one of said first and second delayers and said phase detector therethrough in response to a corresponding one of the first and second control signals from said controller.

13. A voltage-to-time converter comprising:
- a series connection of a current source, a first switch and a capacitor, said first switch having a control end for receiving a first control signal such that said first switch is operable between an ON-state and an OFF-state in response to the first control signal;
- a comparator having a first input end coupled to a common node of said first switch and said capacitor, a second input end adapted for receiving an input voltage, and an output end;
- a second switch adapted to be coupled between said first input end of said comparator and a reference voltage source, and having a control end for receiving a second control signal such that said second switch is operable between an ON-state and an OFF-state in response to the second control signal;
- a first flip-flop having a high-level data input, a clock input adapted for receiving a reference clock, a clear input coupled to said output end of said comparator, a data output coupled to said control end of said first switch and outputting the first control signal to said control end of said first switch, and an inverted data output coupled to said control end of said second switch and outputting the second control signal to said control end of said second switch; and
- a second flip-flop having a low-level data input, a clock input adapted for receiving the reference clock, a set input coupled to said output end of said comparator, and a data output for outputting an output clock;
wherein the output clock outputted by said second flip-flop has a time delay relative to the reference clock, the time delay corresponding to the input voltage.

14. The voltage-to-time converter as claimed in claim 13, wherein:
said current source supplies a constant current;
said capacitor has a constant capacitance; and
the time delay is proportional to the input voltage.

* * * * *